United States Patent
Motz (10) Patent No.: US 9,024,629 B2
(45) Date of Patent: May 5, 2015

(54) HALL SENSORS HAVING FORCED SENSING NODES

(71) Applicant: Infineon Technologies AG, Neubiberg (DE)

(72) Inventor: Mario Motz, Wernberg (AT)

(73) Assignee: Infineon Technologies AG, Neubiberg (DE)

( * ) Notice: Subject to any disclaimer, the term of this patent is extended or adjusted under 35 U.S.C. 154(b) by 86 days.

(21) Appl. No.: 13/621,336

(22) Filed: Sep. 17, 2012

(65) Prior Publication Data

US 2013/0069641 A1   Mar. 21, 2013

Related U.S. Application Data

(60) Provisional application No. 61/535,669, filed on Sep. 16, 2011.

(51) Int. Cl.
*G01R 33/07* (2006.01)

(52) U.S. Cl.
CPC ................................... *G01R 33/075* (2013.01)

(58) Field of Classification Search
CPC ........ G05B 15/02; G05B 11/16; G05B 19/00; G05B 19/042; G06K 19/06206; B60R 1/02; B60R 1/12; B60R 2001/1215; B60R 2001/1253; G05D 1/00; G05D 7/06; G01R 33/075; G01R 33/0023; G01R 33/07
See application file for complete search history.

(56) References Cited

U.S. PATENT DOCUMENTS

| | | | |
|---|---|---|---|
| 3,823,354 A | 7/1974 | Janssen | |
| 4,041,026 A | 8/1977 | Ogata et al. | |
| 5,747,995 A | 5/1998 | Spies | |
| 6,064,202 A | 5/2000 | Steiner et al. | |
| 6,184,679 B1 | 2/2001 | Popovic | |
| 6,727,563 B1 | 4/2004 | Hohe | |
| 6,768,301 B1 | 7/2004 | Hohe et al. | |
| 7,425,821 B2* | 9/2008 | Monreal et al. | 324/117 H |
| 7,782,050 B2 | 8/2010 | Ausserlechner | |
| 7,872,322 B2 | 1/2011 | Schott | |
| 8,030,918 B2* | 10/2011 | Doogue et al. | 324/251 |
| 8,093,891 B2 | 1/2012 | Rocznik | |
| 8,829,900 B2 | 9/2014 | Ausserlechner | |
| 8,896,303 B2 | 11/2014 | Ausserlechner et al. | |
| 2003/0102909 A1 | 6/2003 | Motz | |
| 2004/0212029 A1 | 10/2004 | Boor | |

(Continued)

FOREIGN PATENT DOCUMENTS

| | | |
|---|---|---|
| CN | 101762796 A | 6/2010 |
| CN | 101923266 A | 12/2010 |

(Continued)

OTHER PUBLICATIONS

Ausserlechner. Udo, *Limits of Offset Cancellation by the Principle of Spinning Current Hall Probe*. Infineon Technologies AG, 4 pages, Oct. 2004.

(Continued)

*Primary Examiner* — Tung X Nguyen (74) *Attorney, Agent, or Firm* — Eschweiler & Associates, LLC (57) ABSTRACT

Embodiments relate to forced spinning Hall sensors. In embodiments, forced Hall sensors can provide reduced residual offset, lower current consumption and improved or complete rejection of nonlinear backbias effects when compared with conventional approaches.

22 Claims, 6 Drawing Sheets

(56) References Cited

U.S. PATENT DOCUMENTS

| | | |
|---|---|---|
| 2005/0258840 A1 | 11/2005 | Ausserlechner |
| 2006/0097715 A1 | 5/2006 | Oohira |
| 2009/0256559 A1 | 10/2009 | Ausserlechner |
| 2010/0002821 A1 | 1/2010 | Hammerschmidt et al. |
| 2010/0123458 A1 | 5/2010 | Schott |
| 2010/0133632 A1 | 6/2010 | Schott |
| 2011/0074405 A1 | 3/2011 | Doogue |
| 2012/0001279 A1 | 1/2012 | Hioka et al. |
| 2012/0169329 A1 | 7/2012 | Hellwig |
| 2013/0015853 A1 | 1/2013 | Raz et al. |
| 2013/0021026 A1 | 1/2013 | Ausserlechner |
| 2013/0069640 A1 | 3/2013 | Ausserlechner |
| 2013/0127453 A1 | 5/2013 | Ausserlechner et al. |
| 2013/0214775 A1 | 8/2013 | Ausserlechner et al. |
| 2014/0028304 A1 | 1/2014 | Ausserlechner et al. |
| 2014/0084911 A1 | 3/2014 | Asserlechner et al. |
| 2014/0210458 A1 | 7/2014 | Ausserlechner et al. |
| 2014/0210461 A1 | 7/2014 | Ausserlechner et al. |

FOREIGN PATENT DOCUMENTS

| | | |
|---|---|---|
| DE | 4141386 A1 | 6/1993 |
| DE | 4302342 | 7/1993 |
| DE | 10150950 | 6/2003 |
| DE | 10150955 | 6/2003 |
| DE | 102006037226 | 2/2008 |
| EP | 1438755 B1 | 1/2005 |
| EP | 2071347 | 6/2009 |
| EP | 2192417 | 6/2010 |
| EP | 2546670 | 1/2013 |
| JP | 1251763 | 10/1989 |
| WO | WO 03036733 | 5/2003 |
| WO | WO 2004/025742 | 3/2004 |
| WO | WO 2008/048379 A1 | 4/2008 |
| WO | WO 2009/050673 | 4/2009 |
| WO | WO2009050673 | 4/2009 |

OTHER PUBLICATIONS

Vanha, Ralph, *Trench-Hall Devices*, Journal of Microelectromechanical Systems, vol. 9, No. 1, Mar. 2000, pp. 82-87.

Munter, PJA, *A Low-offset Spinning-Current Hall Plate*, Sensors and Actuators, A21-A23, 1990, pp. 743-746.

De Jong, Paul C., *40.1 Smart Silicon Sensors—Examples of Hall-Effect Sensors*, Sensors 2002 Proceedings of IEEE, 5 pages.

Popovic, R.S., *Hall Devices for Magnetic Sensor Microsystems*, 1997, IEEE International Conference on Solid State Sensors and Actuators, Chicago, Jun. 16-19, 1997, p. 377-380.

Application and File History for U.S. Appl. No. 13/298,917, filed Nov. 17, 2011, Inventor: Ausserlechner.

German Examination Report for German Application No. 102013110633.1 dated May 27, 2014. English translation not available.

U.S. Appl. No. 13/223,527, filed Sep. 15, 2011 inventor Ausserlechner.

U.S. Appl. No. 13/559,197, filed Jul. 28, 2012 inventors Ausserlechner et al.

U.S. Appl. No. 13/627,468, filed Sep. 26, 2012, inventor Ausserlechner et al.

U.S. Appl. No. 13/753,190, filed Jan. 29, 2013 inventors Ausserlechner et al.

U.S. Appl. No. 13/559,197, filed Jul. 26, 2012, Inventor: Udo Ausserlechner.

U.S. Appl. No. 13/627,468, filed Sep. 26, 2012, Inventor: Udo Ausserlechner.

U.S. Appl. No. 13/753,190, filed Jan. 29, 2013, Inventor: Udo Ausserlechner.

U.S. Appl. No. 14/056,627, filed Oct. 17, 2013, inventors Granig et al.
U.S. Appl. No. 14/025,115, filed Sep. 12, 2013, inventors Motz.
Office Action from related Chinese Application 201201345928.4, dated Oct. 10, 2014, 14 pgs.

* cited by examiner

HALL SENSORS HAVING FORCED SENSING NODES

RELATED APPLICATION

This application claims priority to U.S. Application No. 61/535,669, filed Sep. 16, 2011, which is incorporated herein by reference in its entirety.

TECHNICAL FIELD

The invention relates generally to Hall sensors and more particularly to spinning Hall sensors with forced sensing nodes for improved offset reduction.

BACKGROUND

In spinning Hall sensors, in particular vertical Hall sensors, an undesired residual offset after spinning is observed. This offset is caused primarily by nonlinear voltage-dependent resistors in the Hall plate and is known as the "junction-field effect" or "backbias effect" of the Hall plates.

Figure 1A:
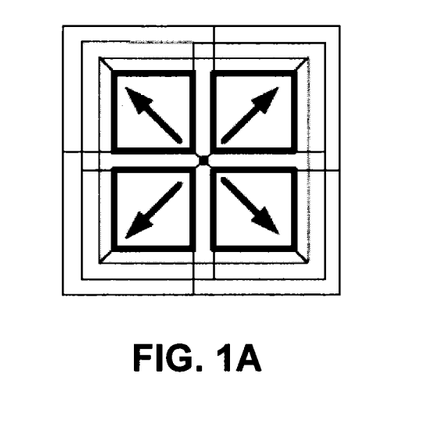
FIG. 1A is a diagram of conventional 90-degree parallel switching of Hall plates according to an embodiment.
Figure 1B:
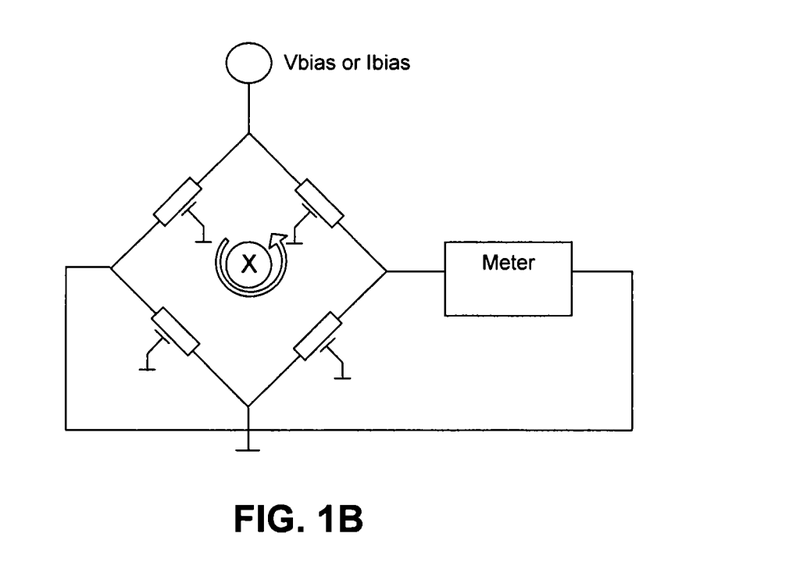
FIG. 1B is a diagram of a conventional biasing arrangement of Hall plates according to an embodiment.

Referring to FIG. 1, conventional efforts to address the residual offset include 90-degree parallel switching of the Hall plates (FIG. 1A), with a biasing voltage or current applied in each spinning phase and a differential voltage or current read as output (FIG. 1B). Such a "forced symmetry" approach, however, reduces but does not eliminate the offset. This is true in particular with respect to vertical Hall plates, which are asymmetrical in different spinning phases, though it applies as well to lateral Hall plates having a mismatch in the Hall plate itself and/or local stress effects.

SUMMARY

Embodiments relate to forced Hall sensors. In an embodiment, a method comprises applying a bias signal to a first node of a Hall plate; forcing a voltage level at second and third nodes of the Hall plate to a fixed value; measuring a differential signal in each of first and second feedback circuits coupled, respectively, to the second and third nodes; and determining a magnetic field output signal from the differential signals.

In an embodiment, a Hall sensor comprises a Hall plate; a bias source coupled to a first node of the Hall plate; a feedback circuit coupled to a second node and a third node of the Hall plate; a voltage source coupled to the feedback circuit; a first current source coupled to the feedback circuit and selectively coupleable to one or the other of the second and third nodes and configured to inject a common mode current at the second or third node; a second current source coupled to the feedback circuit and selectively coupleable to one or the other of the third and second nodes and configured to inject a common mode current at the third or second node; circuitry selectively coupleable to the second and third nodes; and an output signal related to a differential signal at an output of the feedback circuit and an output of the circuitry.

BRIEF DESCRIPTION OF THE DRAWINGS

The invention may be more completely understood in consideration of the following detailed description of various embodiments of the invention in connection with the accompanying drawings, in which.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

Embodiments relate to forced spinning Hall sensors. In embodiments, forced Hall sensors can provide reduced residual offset error, lower current consumption and improved or complete rejection of nonlinear backbias effects when compared with conventional approaches.

Offset error is the presence of an output signal in the absence of some input quantity. In an example related to Hall sensors, the offset error would be an output signal indicative of an input magnetic field when in fact no magnetic field is present. Offset error can relate to different causes, two of which are raw offset error and residual offset error. Raw offset error can refer to an offset error present in a particular operating phase, while residual offset error can refer to an offset error present in an overall or total output signal, such as a signal which is a combination of those from individual operating phases. Operating or spinning phases refer to operating the sensor in multiple different phases in which terminals of the sensor are differently coupled with voltage or current sources and an output is taken at different terminals in each phase. The output signals from each phase can then be combined after all of the operating or spinning phases are complete to obtain a total or overall output signal.

Figure 2A:
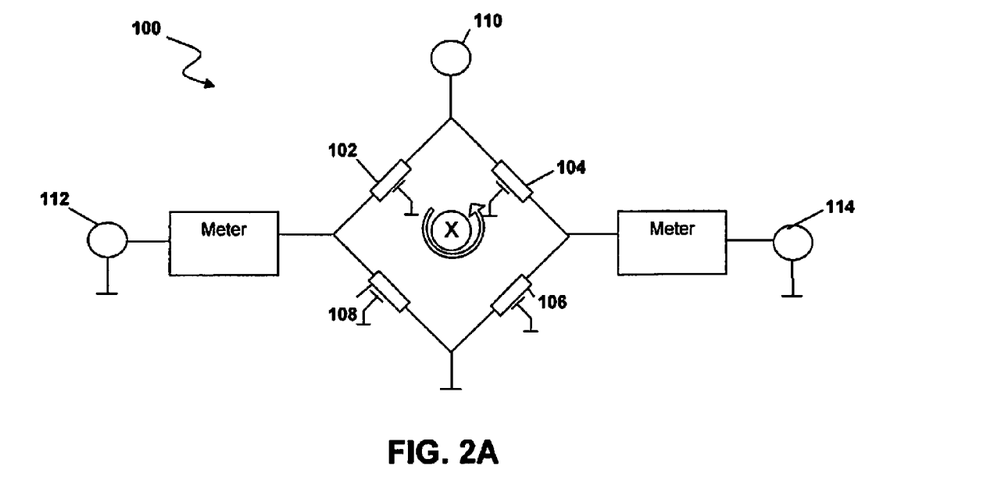
FIG. 2A is a diagram of a Hall plate circuit according to an embodiment.

Referring to FIG. 2A, an embodiment of a Hall plate equivalent circuit 100 is depicted. Hall plate circuit 100 comprises four resistors 102, 104, 106 and 108 in the embodiment depicted, arranged between upper and lower, and left and right, nodes or contacts. In other embodiments, some other number of resistors can be included in circuit 100. While the lower node is depicted in FIG. 2A and elsewhere herein as being referenced to ground, in other embodiments some other reference potential can be used instead of ground wherever it is depicted.

In an embodiment, a fixed bias voltage, Vbias, 110 is applied in each spinning phase of Hall plate circuit 100. In another embodiment, a fixed bias current, Ibias, is applied, where fixed is used in the context of the current being the same in all spinning phases but can be regulated or controlled, such as to compensate for temperature or technology variations. In yet another embodiment, two partial phases of each spinning phase can also be used.

Additionally, fixed voltages 112 and 114 are applied at the sensing nodes of Hall plate 100. In one embodiment, fixed voltages 112, 114 are each about half of Vbias, or Vbias/2. In other embodiments, fixed voltages 112, 114 are each within about +/−10% of half of Vbias. In still other embodiments, fixed voltages 112, 114 are some other voltage. In another embodiment, the sensing nodes of Hall plate circuit 100 are forced to a common mode voltage, such as Vbias/2, within about +/−10% of Vbias/2, or some other fixed voltage, where fixed again is used in the context mentioned above, in which the voltage is regulated or controlled to the same level in all spinning phases. In one embodiment, the fixed voltage is regulated to within about +/−10% of the mean value of the common mode voltages from the previous four spinning phases, for example.

While it may seem counterintuitive at first to fix the voltage (or current) at the sensing nodes, a feedback circuit at the output can provide a voltage drop or a digital value that can be measured, with that voltage drop translated to a magnetic field sensor output. These and other embodiments will be depicted and discussed in more detail herein below.

Figure 3:
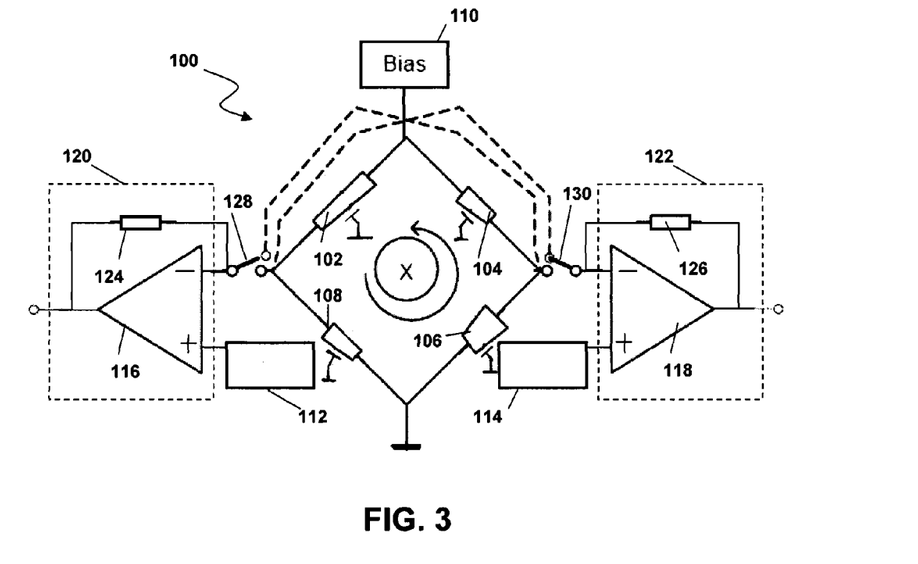
FIG. 3 is a diagram of a Hall plate circuit according to an embodiment.

In operation, and referring also to FIG. 3, bias voltage Vbias is applied as depicted to the bias nodes, with the lower bias node being set to some reference potential, such as ground. A differential voltage typically results at the sensing nodes, from a magnetic field at the sensing nodes, with a common mode voltage also resulting from the resistor divider of equivalent Hall plate circuit 100. This common mode voltage is not exactly equal to the force voltage, such as Vbias/2 in one embodiment, because the back-bias modulates the resistors to different degrees. For example, the upper resistors 102 and 104 can see more voltage related to the substrate voltage, which can be connected to ground. Thus, a J-FET, or backbias, effect results, which in turns makes upper resistors 102 and 104 more highly resistive than lower resistors 106 and 108. The resulting common mode voltage, or the mean value of the sensing nodes to ground or some other reference potential, becomes somewhat smaller than Vbias/2, such as within about +/−10% of Vbias/2.

The backbias effect has both linear and nonlinear coefficients. In each spinning phase of Hall plate circuit 100, resistors 102-108 see different node voltages and vary in a nonlinear way. The unavoidable mismatch of the resistor bridge of resistors 102-108 is multiplied by these nonlinear dependencies and creates a residual offset after spinning.

Also in each spinning phase, a chopped current-to-voltage conversion at an output of an amplifier 116 and 118 of a feedback circuit 120 and 122, respectively, can be carried out. Feedback circuits 120, 122 regulate the sensing nodes, such as to Vbias/2, within about +/−10% of Vbias/2 or some other voltage in an embodiment, because a virtual zero-voltage occurs between the inputs of amplifiers 116 and 118. Thus, a differential voltage (typically the signal voltage) is rejected at the sensing nodes, and the sensing nodes are forced to within about +/−10% Vbias/2 or some other value in this embodiment.

The original differential voltages, however, are converted to differential currents at the output nodes because these nodes are now virtual differential short-circuits:

$$I_{diff\_out} = V_{diff\_out}/R_{diff}$$

where Rdiff is the internal resistance of Hall plate 100 between sensing nodes. The differential current thus can flow only through feedback resistors 124 and 126, creating a differential voltage drop across resistors 124 and 126 that can be measured. With the common mode value of the resulting voltages neglected, the differential voltage provides a compensated output signal indicative of the magnetic field sensor output.

In embodiments, only one forcing voltage 112, 114 is used at any one time. Additionally, the offsets of amplifiers 116 and 118 can be rejected by exchanging each with the opposite sensing node in each spinning phase, essentially doubling a four-phase spinning system to an eight-phase spinning system. Thus, circuit 100 also comprises switches 128 and 130 for coupling and decoupling to accomplish this exchanging.

Figure 2B:
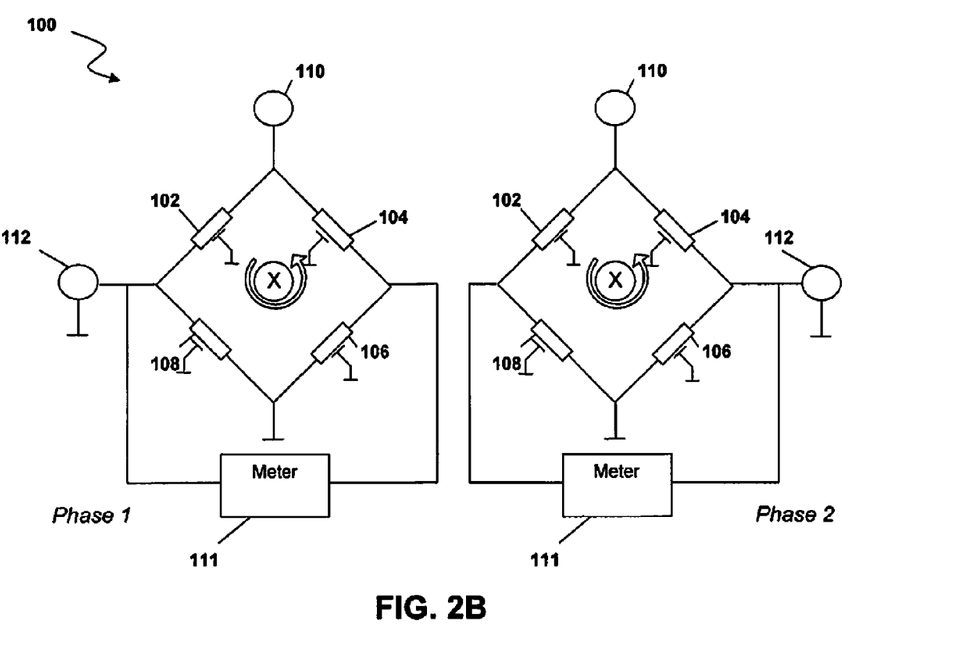
FIG. 2B is a diagram of a Hall plate circuit according to an embodiment.

Referring to FIG. 2B, in yet another embodiment, two partial phases of each spinning phase can also be used. In the embodiment of FIG. 2B, a first sensing node of Hall plate equivalent circuit 100 is forced by a source 112 to a fixed voltage, such as Vbias/2, +/−10% of Vbias/2, or some other voltage in embodiments, wherein source 110 is Vbias. A short-circuit is created between the first node and a second sensing node, such as by an ammeter 111. This short-circuit forces the second node to the fixed voltage in this embodiment. The current in the short-circuit can then be measured in two phases, Phases 1 and 2 as illustrated, in order to determine the differential output signal.

Figure 4:
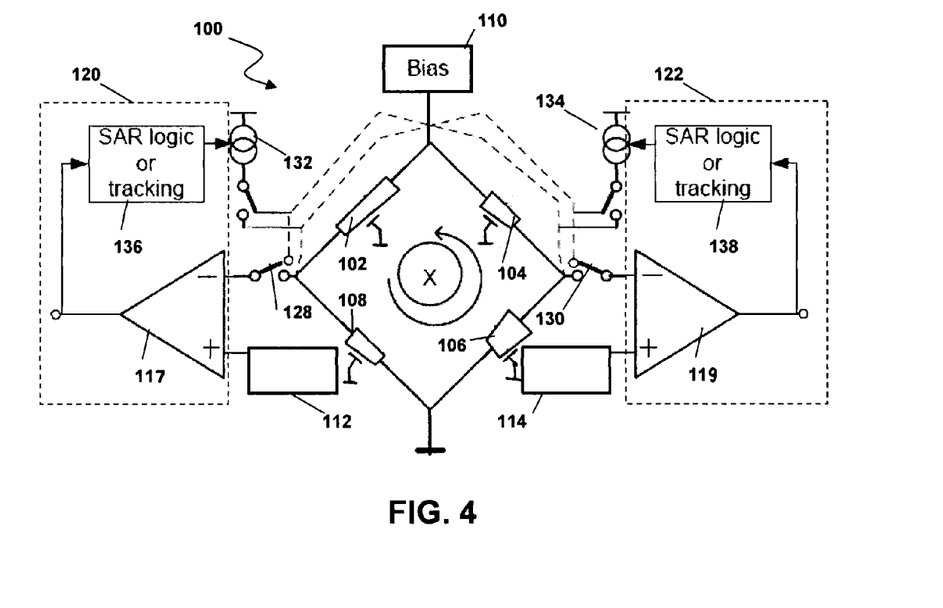
FIG. 4 is a diagram of a Hall plate circuit according to an embodiment.

In another embodiment and referring to FIG. 4, fixed voltages 112, 114 are forced to a common mode voltage, or within about +/−10% of the mean value of the sensing nodes to ground or some other reference potential. In embodiments, this can be Vbias/2 or any other fixed voltage, by current injection to the sensing nodes with the same current on both sides of circuit 100. In an embodiment, mismatch errors between current sources 132 and 134 can be reduced or eliminated by chopping of the currents in each spinning phase or subsequent spinning phases.

In the embodiment of FIG. 4, feedback circuits 120 and 122 comprise digital-to-analog converters (DACs) and tracking logic and comparator blocks 136 and 138. Tracking logic blocks 136 and 138 can also comprise one or more of synamic tracking, successive approximation (such as successive approximation registers, or SARs), sigma-delta modulation techniques and/or other logic, to track the magnetic input signal, in one embodiment, among other possible tasks. Circuits 120 and 122 force the sensing nodes to Vbias/2, or some other forced voltage in other embodiments, because the regulation loops try to reach a virtual zero-voltage between the inputs of comparators 117, 119. After the feedback loops settle, the DACs of blocks 136, 138 contain a common mode signal, which can be neglected, and a compensated output signal after chopping.

The chopping of the DACs and comparators 117, 119 can be done, in embodiments, in one spinning phase or in between sequential spinning phases. Also, the DACs can be exchanged with a common mode DAC and a differential DAC.

Figure 5A:
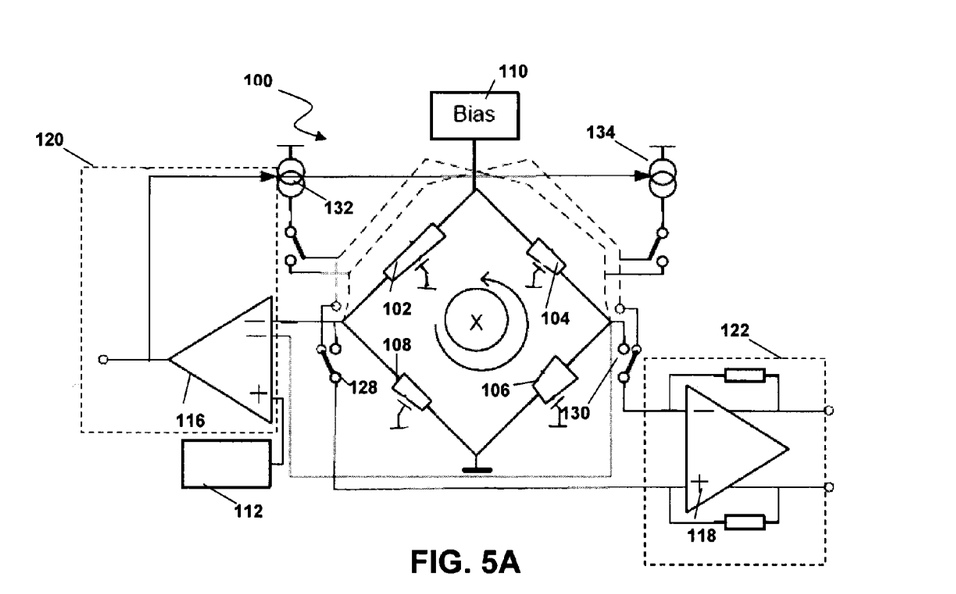
FIG. 5A is a diagram of a Hall plate circuit according to an embodiment.

Another embodiment is depicted in FIG. 5A, in which circuit 100 comprises a differential feedback circuit for current-to-voltage conversion and common mode regulation with a chopped DAC. On the left side (as depicted on the page) of circuit 100, a common-mode regulation loop 120 provides the mean value of the sensing nodes at the double negative input of common mode regulation amplifier 116. Loop 120 injects two substantially equal currents to the sensing nodes of the Hall plate and thus is able to change the common mode voltage at the sensing nodes. In settled regulation mode, the virtual zero-voltage between the positive and double negative inputs of amplifier 116 forces the common mode voltage to within about +/−10% of Vbias/2 or some other fixed voltage, in this embodiment. Differential current, which comprises the desired compensated Hall signal, is translated to a differential voltage by the differential current-to-voltage converter 122 on the right side of circuit 100.

Figure 5B:
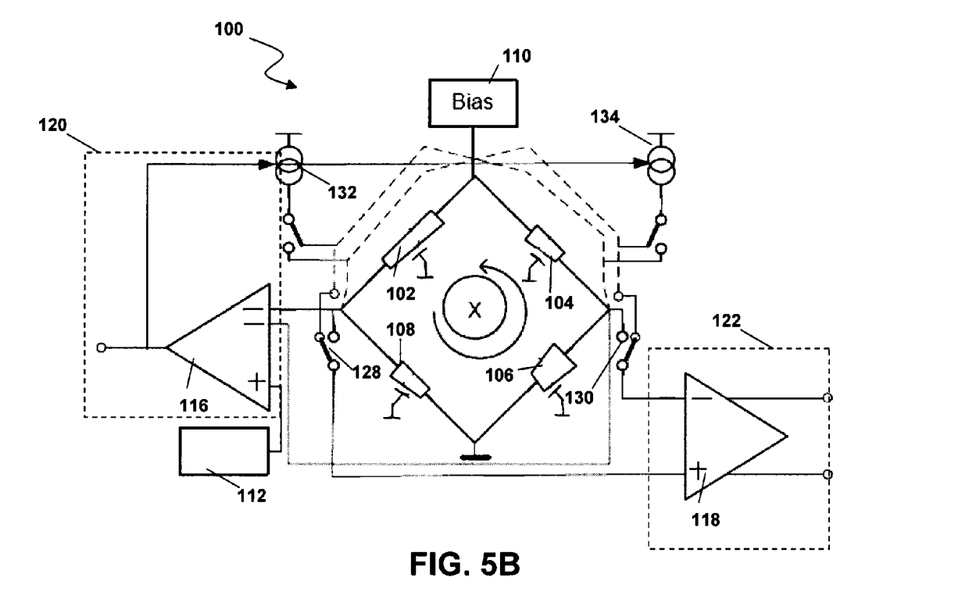
FIG. 5B is a diagram of a Hall plate circuit according to an embodiment.

In another embodiment depicted in FIG. 5B, circuit 100 comprises a chopped instrumentation amplifier 118 to amplify the differential voltage and common mode regulation with chopped regulated current sources or current steering DACs, for example. Similar to FIG. 5A, circuit 100 of FIG. 5B regulates the common mode voltage in the same way. In FIG. 5B, however, the differential output voltage, instead of the differential output current, can be measured and amplified with a chopped instrumentation amplifier 118, which is highly resistive at its inputs.

Figure 6:
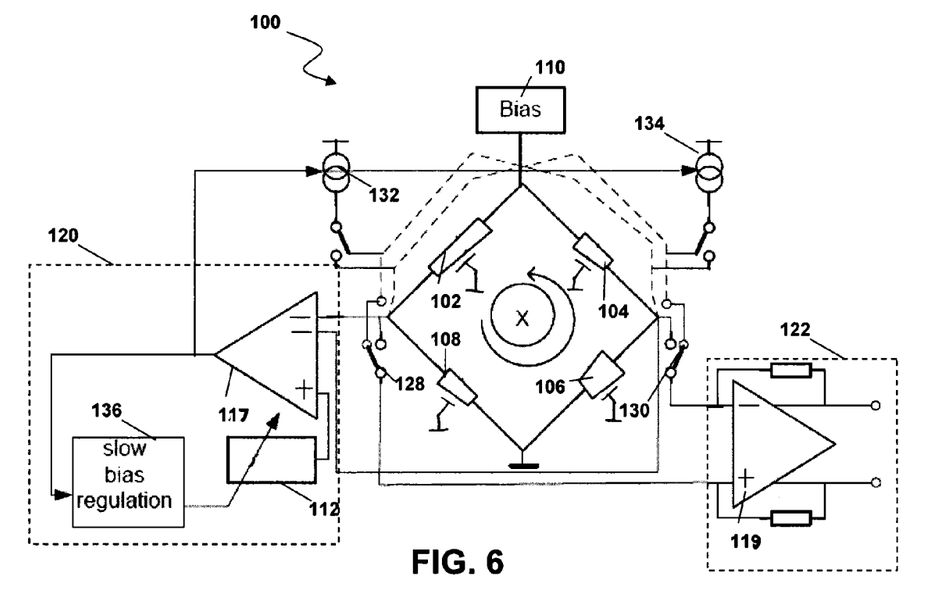
FIG. 6 is a diagram of a Hall plate circuit according to an embodiment.

In FIG. 6, an embodiment of circuit 100 is depicted comprising a differential feedback circuit for current-to-voltage conversion and a slow common mode regulation for sensing node bias voltage. Slow regulation, or slower than the spinning phases, can avoid rippling common mode currents. Such currents can create an undesired differential voltage via different contact resistances. In FIG. 6, feedback DACs of slow bias regulation block 136 provide a common mode shift of sensing nodes to force the sensing nodes to Vbias/2, or some other fixed or slowly regulated voltage. The chopped differential current-to-voltage converter includes the compensated differential output signal.

Figure 7:
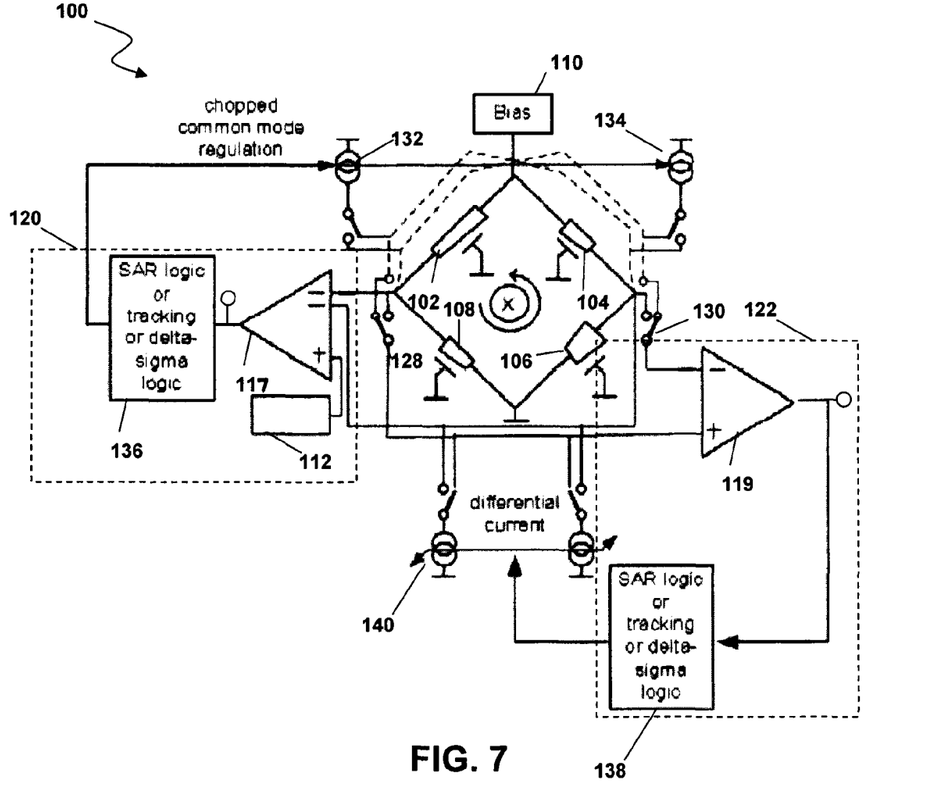
FIG. 7 is a diagram of a Hall plate circuit according to an embodiment.

Another embodiment is depicted in FIG. 7, which is somewhat similar to FIGS. 4 and 5B. In the embodiment of FIG. 7, however, a single comparator 117 of circuit 120 is used for common mode forcing of the signal nodes to about +/−10% of Vbias/2 in embodiments. A second comparator 119 of circuit 122 is used for differential signal feedback. Circuit 122 thereby controls a differential current 140 to force the sensing nodes to about +/−10% of Vbias/2, or some other voltage in other embodiments. The output of circuit 100 is related to a differential signal at an output of the feedback circuit and an output of the circuitry, as in other embodiments.

Additionally or alternatively to the above discussion, additional embodiments are also disclosed. In an embodiment, a Hall sensor system comprises a bias source; a Hall plate having a first node coupled to the bias source; a first feedback circuit coupled to a second node of the Hall plate; a second feedback circuit coupled to a third node of the Hall plate; at least one source configured to fix at least one of the second or third nodes at a force voltage; a magnetic field signal output of the sensor determined from a differential signal in each of the first and second feedback circuits. The at least one source can comprise a voltage source coupled to an input of an amplifier of at least one of the first or second feedback circuits. The Hall sensor system can further comprise a second source comprising a voltage source coupled to an input of an amplifier of the other of the first or second feedback circuits. The Hall sensor system can further comprise a plurality of sources, at least one of the plurality of sources comprising a current source. The Hall sensor system can further comprise logic circuitry coupled to at least one of the first or second feedback circuits and configured to regulate a common mode voltage of the Hall sensor. The differential signal can comprise at least one of a voltage, a current or a digital value. The Hall sensor system can further comprise a common mode feedback circuit configured to force a common mode voltage at the second and third nodes to the force voltage, wherein the first and second feedback circuits comprise a differential feedback circuit configured to condition a Hall signal.

In an embodiment, a method comprises providing a bias current in a Hall plate, the bias current generated by having first charge carriers injected at a bias node of the Hall plate; forcing at least one sensing node of the Hall plate to a fixed voltage, the forcing comprising transporting electric charge from external to the at least one sensing node to the at least one sensing node such that an influence to a voltage at the at least one sensing node caused by a deflection of first charge carriers is compensated by the transporting of electric charges; and determining a magnetic field output signal based on at least one characteristic of the transporting of electric charges from external to the at least one sensing node to the at least one sensing node. The at least one characteristic can comprise at least one of a differential voltage, a differential current or a digital signal value.

In an embodiment, Hall sensor circuitry comprises a Hall plate; a first voltage source coupled to a first node of the Hall plate to provide a bias voltage; a connection between a second node and a third node of the Hall plate; a second voltage source coupled, in a first phase, to the second node of the Hall plate and, in a second phase, to the third node of the Hall plate, to provide a voltage related to the bias voltage; and an ammeter coupled to the connection to measure a current flow between the second and third nodes in the first phase and the second phase, the current flow related to a magnetic field output signal of the Hall sensor circuitry. The connection can comprise a short-circuit connection. The voltage related to the bias voltage can be within about +/−10% of half of the bias voltage. The voltage related to the bias voltage can be regulated from within about +/−10% of a mean value of a previously measured common mode voltage of the Hall sensor circuitry. The ammeter can comprise a differential feedback circuit configured to measure a differential signal current.

In an embodiment, a Hall sensor comprises a Hall plate; a bias source configured to apply a bias signal to a first node of the Hall plate; a first source coupled to a second node of the Hall plate and configured to force the second node to a fixed value; a second source coupled to a third node of the Hall plate and configured to force the third node to the fixed value; a first feedback circuit selectively coupleable to the second node; a second feedback circuit selectively coupleable to the third node; and a magnetic field output signal related to a first differential signal of the first feedback circuit and a second differential signal of the second feedback circuit. The first feedback circuit can be selectively coupleable to the third node and the second feedback circuit is selectively coupleable to the second node. The fixed value can be within about +/−10% of half of the bias signal. Each of the bias signal and the fixed value can comprise one of a voltage, a current or a digital signal. The first and second differential signals can comprise one of a voltage, a current or a digital value. Each of the first and second feedback circuits can comprise an amplifier and a resistor, and wherein the first and second differential signals are measured across the respective resistor. The fixed value can be regulated by at least one of a temperature measurement or a mechanical stress measurement.

In an embodiment, a Hall sensor system comprises a Hall plate comprising at least four nodes, a first of the nodes coupled to a bias source; a first feedback circuit coupled to a second of the nodes; a second feedback circuit coupled to a third of the nodes; a first source coupled to at least one of the first or second feedback circuits and configured to fix at least one of the second or third of the nodes at a force voltage; a second source coupled to at least one of the first or second feedback circuits and configured to fix at least one of the second or third of the nodes at the force voltage; and a magnetic field signal output of the sensor determined from a differential signal in each of the first and second feedback circuits. The bias source can be a voltage source. The force voltage can be within about +/−10% of half of a voltage of the voltage source. The bias source can be a current source. The force voltage can be within about +/−10% of half of a voltage of the bias source. The Hall sensor system can further comprise first and second switches each coupled to one of the second and third nodes and configured to selectively exchange coupling of the first and second feedback circuits and the second and third nodes. The first and second feedback circuits can comprise an amplifier and at least one of a feedback resistor or a digital-to-analog converter circuitry. Each of the first and second feedback circuits can comprise an amplifier, and wherein the first and second sources are each coupled to a positive input of one of the amplifiers. Each of the first and second sources can comprise a voltage source. The first and second sources can comprise a common voltage source. Each of the first and second sources can comprise a current source. The Hall sensor can comprise a spinning Hall sensor. The force voltage can be regulated according to a common mode voltage of at least one previous spinning phase of the Hall sensor. The force voltage can be regulated according to a fixed voltage. The force voltage can be regulated according to at least one of a temperature parameter or a mechanical stress measurement.

Embodiments thereby provide distinctions from and improvements with respect to conventional approaches. For example, in embodiments the common mode voltage is regulated at the input of the amplifier, which is coupled with differential output nodes of a resistive sensor bridge. This differs from convention approaches which instead regulate the common mode voltage at intermediate or output nodes of amplifiers. Other advantages include reduced residual offset, lower current consumption because parallel switching of the Hall probes is unnecessary, and improved or complete rejection of nonlinear backbias effects.

Various embodiments of systems, devices and methods have been described herein. These embodiments are given only by way of example and are not intended to limit the scope of the invention. It should be appreciated, moreover, that the various features of the embodiments that have been described may be combined in various ways to produce numerous additional embodiments. Moreover, while various materials, dimensions, shapes, configurations and locations, etc. have been described for use with disclosed embodiments, others besides those disclosed may be utilized without exceeding the scope of the invention.

Persons of ordinary skill in the relevant arts will recognize that the invention may comprise fewer features than illustrated in any individual embodiment described above. The embodiments described herein are not meant to be an exhaustive presentation of the ways in which the various features of the invention may be combined. Accordingly, the embodiments are not mutually exclusive combinations of features; rather, the invention can comprise a combination of different individual features selected from different individual embodiments, as understood by persons of ordinary skill in the art. Moreover, elements described with respect to one embodiment can be implemented in other embodiments even when not described in such embodiments unless otherwise noted. Although a dependent claim may refer in the claims to a specific combination with one or more other claims, other embodiments can also include a combination of the dependent claim with the subject matter of each other dependent claim or a combination of one or more features with other dependent or independent claims. Such combinations are proposed herein unless it is stated that a specific combination is not intended. Furthermore, it is intended also to include features of a claim in any other independent claim even if this claim is not directly made dependent to the independent claim.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims for the present invention, it is expressly intended that the provisions of Section 112, sixth paragraph of 35 U.S.C. are not to be invoked unless the specific terms "means for" or "step for" are recited in a claim.

What is claimed is:

1. A method comprising:
applying a bias signal to a first node of a Hall plate;
forcing a voltage level at second and third nodes of the Hall plate to a fixed value;
measuring a differential signal in each of first and second feedback circuits coupled, respectively, to the second and third nodes; and
determining a magnetic field output signal from the differential signals.

2. The method of claim 1, wherein applying a bias signal comprises applying a bias voltage.

3. The method of claim 2, wherein forcing a voltage level comprises applying a voltage within about +/−10% of half of the bias voltage.

4. The method of claim 1, wherein applying a bias signal comprises applying a bias current.

5. The method of claim 4, wherein forcing a voltage level comprises applying a bias current to force the second and third nodes to a voltage within about +/−10% of half of the bias signal.

6. The method of claim 1, wherein measuring a differential signal comprises measuring at least one of a differential voltage, a differential current or a differential digital value.

7. The method of claim 1, wherein determining a magnetic field output signal comprises ignoring a common mode value of the differential signals.

8. The method of claim 1, further comprising operating the Hall plate in a spinning mode.

9. The method of claim 1, wherein the first and second feedback circuits comprise a single differential feedback circuit.

10. The method of claim 1, wherein measuring a differential signal further comprises measuring a voltage drop across a feedback resistor coupled to an operational amplifier, wherein each of the first and second feedback circuits comprise a feedback resistor and an operational amplifier.

11. The method of claim 1, further comprising selectively exchanging coupling of the first and second feedback circuits with the second and third nodes by switching.

12. A Hall sensor comprising:
a Hall plate;
a bias source coupled to a first node of the Hall plate;
a feedback circuit coupled to a second node and a third node of the Hall plate;
a voltage source coupled to the feedback circuit;
a first current source coupled to the feedback circuit and selectively coupleable to one or the other of the second and third nodes and configured to inject a common mode current at the second or third node;
a second current source coupled to the feedback circuit and selectively coupleable to one or the other of the third and second nodes and configured to inject a common mode current at the third or second node;

circuitry selectively coupleable to the second and third nodes; and an output signal related to a differential signal at an output of the feedback circuit and an output of the circuitry.

13. The Hall sensor of claim 12, wherein the circuitry selectively coupleable to the second and third nodes comprises at least one of an amplifier or an analog-to-digital converter (ADC).

14. The Hall sensor of claim 12, wherein an output of the circuitry selectively coupleable to the second and third nodes is coupled to a differential current source.

15. The Hall sensor of claim 12, wherein the circuitry selectively coupleable to the second and third nodes comprises a comparator selectively coupleable to the second and third nodes.

16. The Hall sensor of claim 12, wherein the feedback circuit comprises a common mode feedback circuit configured to force a common mode voltage at the second and third nodes to the force voltage.

17. The Hall sensor system of claim 12, wherein the bias source is a voltage source.

18. The Hall sensor system of claim 12, wherein the bias source is a current source.

19. The Hall sensor system of claim 12, wherein the first feedback circuit comprises a comparator.

20. The Hall sensor system of claim 12, further comprising switches to selectively couple the circuitry to the second and third nodes.

21. The Hall sensor system of claim 12, wherein the circuitry comprises a comparator.

22. The Hall sensor system of claim 12, wherein the Hall sensor comprises a spinning Hall sensor.

* * * * *